United States Patent [19]

Shimada et al.

[11] Patent Number: 5,793,117
[45] Date of Patent: Aug. 11, 1998

[54] SEMICONDUCTOR DEVICE AND METHOD OF FABRICATING THE SAME

[75] Inventors: Yuzo Shimada; Naoji Senba; Nobuaki Takahashi, all of Tokyo, Japan

[73] Assignee: NEC Corporation, Tokyo, Japan

[21] Appl. No.: 684,617

[22] Filed: Jul. 22, 1996

[30] Foreign Application Priority Data

Jul. 21, 1995 [JP] Japan ................... 7-186022

[51] Int. Cl.⁶ .................. H01L 23/48; H01L 23/52; H01L 29/40
[52] U.S. Cl. ............... 257/780; 257/738; 257/48; 257/734; 438/613; 438/17; 324/754; 324/758
[58] Field of Search ................ 257/780, 737, 257/738, 48; 438/613, 614

[56] References Cited

U.S. PATENT DOCUMENTS

| | | | |
|---|---|---|---|
| 3,882,532 | 5/1975 | Quinn | 257/48 |
| 5,081,421 | 1/1992 | Miller et al. | 324/671 |
| 5,232,962 | 8/1993 | Dershem et al. | 523/442 |
| 5,289,038 | 2/1994 | Amano | 257/780 |
| 5,291,064 | 3/1994 | Kurokawa | 257/714 |
| 5,337,397 | 8/1994 | Lebby et al. | 385/93 |
| 5,348,835 | 9/1994 | Oba et al. | 430/192 |
| 5,363,038 | 11/1994 | Love | 324/158 |
| 5,506,423 | 4/1996 | Saeki | 257/97 |
| 5,523,586 | 6/1996 | Sakurai | 257/48 |
| 5,532,610 | 7/1996 | Tsujide et al. | 324/757 |

FOREIGN PATENT DOCUMENTS

| | | |
|---|---|---|
| 0540312 | 5/1993 | European Pat. Off. . |
| 3-126240 | 5/1991 | Japan . |
| 8911659 | 11/1989 | WIPO . |

*Primary Examiner*—Mahshid D. Saadat
*Assistant Examiner*—Jhihan B. Clark
*Attorney, Agent, or Firm*—Sughrue, Mion, Zinn, Macpeak & Seas, PLLC

[57] ABSTRACT

The invention provides a semiconductor device including a semiconductor substrate formed thereon with at least one recessed portion, an electrically conductive layer covering at least a surface of the recessed portion therewith, and a ball-bump formed on the electrically conductive layer within the recessed portion. The semiconductor device can act as a probe card by additionally having a tester device formed in the semiconductor substrate and provided with a function of testing electrical performances of a semiconductor device. Since the recessed portion can be formed by lithography technique, it is possible to arrange the greater number of pins in a smaller pitch, and in addition, it is also possible to locate ball-bumps in place with higher accuracy than a conventional semiconductor device.

25 Claims, 5 Drawing Sheets

SEMICONDUCTOR DEVICE AND METHOD OF FABRICATING THE SAME

BACKGROUND OF THE INVENTION

1. Field of the Invention

The invention relates to a semiconductor device including an LSI chip, and more particularly to an improvement in locating ball-bumps on a surface of an LSI chip. The invention also relates to a method of fabricating such a semiconductor device.

2. Description of the Related Art

A conventional semiconductor device including an LSI chip therein has a flat surface on which a circuit is to be formed and electrically conductive pads made of a material, such as aluminum, which are to be formed thereon. There are further formed, thin films on the pads as an intermediate conductive layer in order to provide soldering material thereon from which a ball-bump is to be made. The thin films are made of, for instance, Cr—Cu—Au, and may be formed by evaporation or sputtering. Ball-bumps made of, for instance, Pb—Sn family solder are mounted on the thin films.

An organic film such as a metallic oxide film and a polyimide film may be used as a passivation film to protect a surface of a semiconductor device on which a circuit is formed.

When IC chips having been formed on a wafer are to be tested as to whether they have expected electrical performances prior to scribing them into individual chips, a probe card is often used for testing IC chips. One of the probe cards that has been suggested is in Japanese Unexamined Patent Publication No. 3-126240. Hereinbelow is explained the probe card with reference to FIGS. 1A to 1D, 2A and 2B. FIGS. 1A to 1D show respective step of fabricating the probe card. FIG. 2A is a plan view of the completed probe card, and FIG. 2B is a bottom view of the same.

First, as illustrated in FIG. 1A, there is prepared a p- or n-type silicon substrate 21. Then, as illustrated in FIG. 1B, a group of ball-bumps 22a are formed on an upper surface of the silicon substrate 21 by etching in alignment with pads mounted on a wafer chip. Similarly, a group of ball-bumps 22b are formed on a lower surface of the silicon substrate 21 by etching in alignment with terminals of a tester independently of the ball-bumps 22a. Then, as illustrated in FIG. 1C, acceptor impurities 23 having the valence of +3 such as B, Al, In and Ga, or donor impurities having the valence of +5 such as As, Sb and P are implanted into the ball-bumps 22a and 22b in order to decrease a resistance of the ball-bumps 22a and 22b. Then, as illustrated in FIGS. 1D, 2A and 2B, there are arranged wirings 24 for electrically connecting the ball-bumps 22a and 22b to each other. In addition, an oxide film is formed over a surface of the silicon substrate 21 except the ball-bumps 22a and 22b to increase a resistance. As illustrated in FIG. 2A, there may be provided a compensation circuit 25 on the silicon substrate 21 in electrical connection with the wirings 24 in order to compensate for the high-frequency.

Then, an X-Y table on which an IC chip to be tested is mounted, is positioned in place. By compressing the ball-bumps 22a onto pads of an IC chip to thereby keep them in electrical connection to each other, the pads are electrically connected to terminals of a tester through the wirings 24 and the ball-bumps 22b. Thus, the IC chip can be tested for electrical performances.

The above mentioned conventional semiconductor device acting as a probe card has shortcomings as to connection between the ball-bumps and pads of an IC chip and so on as follows.

In the formation of ball-bumps on a flat surface of a semiconductor device, it is necessary that electrically conductive pads and electrically conductive thin films to be formed on the pads are positioned in place with high accuracy. If such positional accuracy could not be obtained, the ball-bumps would be formed out of intended position, resulting in that it is considerably difficult or almost impossible to obtain high accuracy and hence high reliability in the connection of the ball-bumps. Even if the ball-bumps could be positioned with high accuracy, it is necessary to prepare jigs and/or equipments for setting ball-bumps, which would increase cost and deteriorate throughput.

In the connection between ball-bumps and a semiconductor device, a problem would arise as to an adhesive force, since the ball-bumps make contact with the device through conductors in a flat fashion. Hence, when the semiconductor device is connected to a package or a module substrate, a stress might exert on the ball-bumps due to a difference in thermal expansion coefficient between the device and such a package or module substrate, resulting in that the device becomes defective.

In the above mentioned conventional probe card, a silicon substrate is formed with silicon projections by etching in order to make contact and hence electrical connection with pads of a wafer chip. However, it is very difficult to control a height of such projections in micrometer order by etching. Thus, it is impossible for etching process to make a probe card which can deal with a chip having the greater number of pins at a smaller pitch.

In addition, since the silicon projections are integral with a silicon substrate, if only one projection would become defective, a whole probe card which contains the defective projection and is to be used for one IC chip becomes defective. Since it is impossible to repair the defective projection, a probe card containing the defective projection has to be wholly abandoned. In addition, a part of a wafer is kept untested, and thereby it becomes necessary to carry out a retest.

The impurities 23, which are implanted into the silicon substrate 21 in order to decrease a resistance of the ball-bumps 22a and 22b, would establish PNP or NPN type parasitic transistors between the adjacent projections, if the silicon substrate 21 was formed with many projections at a small pitch. The parasitic transistors would allow current leakage in the silicon substrate 21, resulting in the problem that it is impossible to exactly test a chip as to electrical performances.

The above mentioned conventional probe card has two functions, one of which is to make contact and hence electrical connection with pads of a wafer chip, the other is to make connection with a tester. Thus, both a probe card and a tester were required for testing a wafer. A tester is usually expensive, and increases fabrication costs.

In general, a chip which has been found defective is marked to clearly show the chip is defective. However, a conventional probe card does not have such a function.

SUMMARY OF THE INVENTION

In view of the foregoing problems of the prior semiconductor device, it is an object of the present invention to provide a semiconductor device in which ball-bumps are positioned in place with high accuracy and ball-bumps are secured to a substrate with high adhesive force, and which can be used as a probe card capable of testing electrical performances of a semiconductor device without any tester. It is also an object of the present invention to provide a method of fabricating such a semiconductor device.

The present invention provides a semiconductor device including a semiconductor substrate formed thereon with at least one recessed portion, an electrically conductive layer covering at least a surface of the recessed portion therewith, and a ball-bump formed on the electrically conductive layer within the recessed portion.

The above mentioned semiconductor device may act as a probe card by additionally including a tester device formed in the semiconductor substrate. The tester device has a function of testing electrical performances of a semiconductor device.

The present invention further provides a semiconductor device including a semiconductor substrate formed on one of upper and lower surfaces thereof with at least one recessed portion, an electrically conductive layer covering at least a surface of the recessed portion therewith, a ball-bump formed on the electrically conductive layer within the recessed portion, a circuit pattern formed on the other surface of the semiconductor substrate, the circuit pattern being electrically connected to the electrically conductive layer via through holes formed in the semiconductor substrate, and a semiconductor chip disposed on the circuit pattern in electrical connection therewith to constitute a tester device having a function of testing electrical performances of a semiconductor device so that the semiconductor device can act as a probe card.

The present invention still further provides a semiconductor device including a semiconductor substrate formed on one of upper and lower surfaces thereof with at least one recessed portion, an electrically conductive layer covering at least a surface of the recessed portion therewith, a ball-bump formed on the electrically conductive layer within the recessed portion, a circuit pattern formed on the other surface of the semiconductor substrate, the circuit pattern being electrically connected to the electrically conductive layer via through holes formed in the semiconductor substrate, a tester device formed below the other surface of the semiconductor substrate, the tester device having a function of testing electrical performances of a semiconductor device so that the semiconductor device can act as a probe card, a light emitting device being designed to emit a light to a semiconductor device which has been found defective by the tester device, and a semiconductor chip disposed on the circuit pattern in electrical connection therewith, the semiconductor chip being designed to have a function for changing the specification of the tester device.

The present invention yet further provides a semiconductor device including a semiconductor substrate formed thereon with at least one recessed portion, a protection film formed over a surface of the semiconductor substrate, an electrically conductive layer covering at least the recessed portion therewith, and a ball-bump formed on the electrically conductive layer within the recessed portion.

The present invention still yet further provides a method of fabricating a semiconductor device including the steps of (a) fabricating a tester device for testing electrical performances of a semiconductor device, (b) forming a recessed portion on a surface of a semiconductor substrate, (c) covering the semiconductor substrate with a metallic oxide layer, (d) forming through holes in the metallic oxide layer, (e) forming an electrically conductive layer over the metallic oxide layer, the metallic layer having electrical connection with the tester device through the through holes, (f) forming a protection layer over the semiconductor substrate except the recessed portion, (g) forming a thin, electrically conductive film over the electrically conductive layer within the recessed portion, and (h) forming a ball-bump covering the recessed portion.

The formation of the recessed portion makes it possible to form a ball-bump precisely in place. In addition, since the recessed portion provides a greater area to make contact with a substrate than a flat surface to a ball-bump, it is possible to increase an adhesive force between a ball-bump and a substrate.

For the purpose of protecting a surface of the semiconductor device on which a circuit is to be formed, there may be formed an oxide film or polymeric resin film on the surface. When there is to be used a silicon substrate, it is preferable to etch a surface having the Miller indices of (100).

If the recessed portion is formed on a (100) surface of the semiconductor substrate, it is possible to form the recessed portion in quadrangular pyramid. Thus, a ball-bump can have a center which is common to a summit of the quadrangular pyramid, and hence, a ball-bump is positioned in place with considerably high accuracy.

The semiconductor device may be used as a probe card by additionally forming a tester device in the semiconductor substrate, and hence can act as a tester. For instance, the repairable ball-bumps formed in the recessed portions act as a contact of a probe card. Thus, it is no longer necessary to prepare both a probe card and a tester.

In addition, the semiconductor device is able to change specification of a tester device. The semiconductor device makes it possible to obtain a remarkably small-sized probe card.

BRIEF DESCRIPTION OF THE DRAWINGS

The above and other objects and advantageous features of the present invention will be made apparent from the following description made with reference to the accompanying drawings, in which like reference characters designate the same or similar parts throughout the drawings, in which.

DESCRIPTION OF THE PREFERRED EMBODIMENTS

Figure 1A:
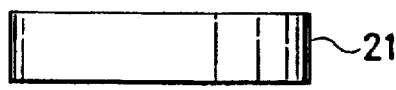
FIGS. 1A to 1D are cross-sectional views of a conventional probe card, showing respective step of a method of fabricating the conventional probe card illustrated in FIGS. 2A and 2B.

Referring now to FIGS. 3 and 4A to 4H, the description is made below on a first embodiment made in accordance with the invention. A semiconductor substrate 1 is constituted of an LSI chip and is sized by 4.5 mm×12.0 mm. The semiconductor circuit 1 is formed therein with recessed portions 16 having a reverse frusto-conical shape. A circuit region 2 is formed in the semiconductor substrate 1 between the adjacent recessed portions 16. In the circuit region 2, there is formed a certain circuit such as a tester for testing electrical performances of a semiconductor device, as mentioned later.

The semiconductor substrate 1 is covered with a metallic oxide film 12 for protecting the circuit region 2 by insulating the circuit region 2 from others. In this embodiment, since the semiconductor substrate 1 is composed of a silicon chip, the metallic oxide film 12 is made of silicon dioxide ($SiO_2$). The metallic oxide film 12 is in turn covered with electrically conductive wirings 4 so that the wirings 4 entirely cover the recessed portions 16. The electrically conductive wirings 4 are made of aluminum. The electrically conductive wirings 4 are in electrical connection with the circuit region 2 through through-holes 19 formed throughout the metallic oxide layer 12.

An electrically conductive, thin film 14 made of Cr—Cu—Au is formed covering the aluminum wirings 4 within the recessed portions 16. Ball-bumps 5 are formed on the recessed portions 16. The electrically conductive, thin films 14 disposed just below the ball-bumps 5 enhance metallization and connection characteristics of the ball-bumps 5. The semiconductor substrate 1 is further covered with a protection film 18 made of polyimide for protecting a surface thereof. However, the ball-bumps 5 are not covered with the protection film 18.

In order to fabricate the semiconductor device as mentioned above, the following process is selected.

Figure 4A:
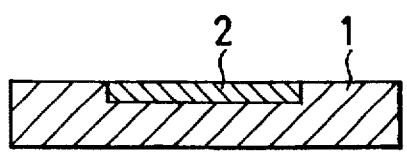
FIGS. 4A to 4H are cross-sectional views of a semiconductor device, illustrating respective steps of a method of fabricating the semiconductor device illustrated in FIG. 3.

First, as illustrated in FIG. 4A, there is prepared a semiconductor silicon wafer, and the circuit region 2 is formed in the semiconductor substrate 1 by using semiconductor diffusion process technique. Then, as illustrated in FIG. 4B, there are formed the recessed portions 16 in the semiconductor substrate 1 in alignment with pads of a semiconductor device to be tested. The silicon of which the semiconductor substrate 1 is made has a surface having Miller indices of (100), and the recessed portions 16 are formed by etching. The etching is carried out in KOH solution with a resist acting as a mask by using lithography technique. The recessed portions 16 are shaped in reverse quadrangular pyramid, and have a square area by 0.1×0.1 mm at a surface of the semiconductor substrate 1. The cross-sectional area of the recessed portions 16 becomes smaller in a depth-wise direction of the semiconductor substrate 1. The recessed portions 16 have a depth of 0.08 mm.

Figure 4E:
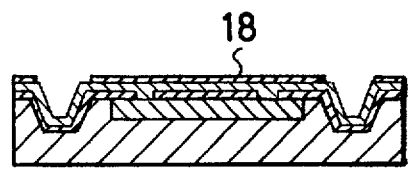
Figure 4B:
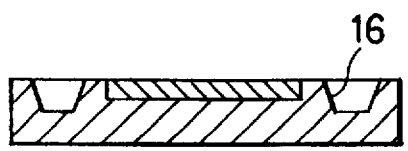
Figure 4F:
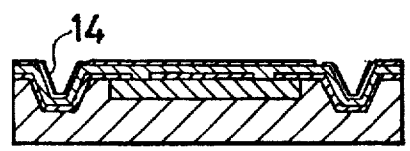
Figure 4C:
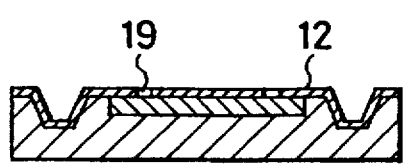

Then, as illustrated in FIG. 4C, a surface of the semiconductor substrate 1 is covered with a metallic oxide film 12 made of silicon dioxide in order to protect the circuit region 2 by insulating the circuit region 2 from others. Then, there are formed contact holes 19 throughout the metallic oxide film 12.

Figure 4G:
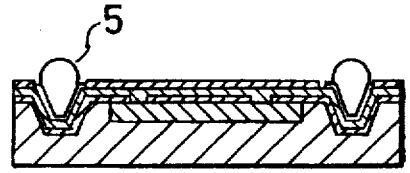
Figure 4D:
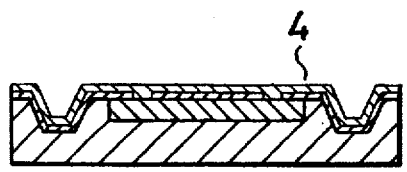

Then, as illustrated in FIG. 4D, there is formed an electrically conductive wiring 4 made of aluminum on the metallic oxide film 12 by sputtering or evaporation. The thus formed electrically conductive wiring 4 is in electrical connection with the circuit region 2 through the contact holes 19 formed throughout the metallic oxide film 12.

Then, as illustrated in FIG. 4E, there is formed a protection film 18 made of polyimide resin on the aluminum wirings 4 except on the recessed portions 16. As illustrated in FIG. 4F, there is formed an electrically conductive, thin film 14 made of Cr—Cu—Au by sputtering, evaporation, electrolysis plating or non-electrolysis plating on the aluminum wiring 4 within the recessed portions 16. The purpose of forming the electrically conductive, thin film 14 is to enhance metallization, wettability and adhesion of the ball-bumps 5. In addition, the film 14 acts also as a barrier metal.

Figure 4H:
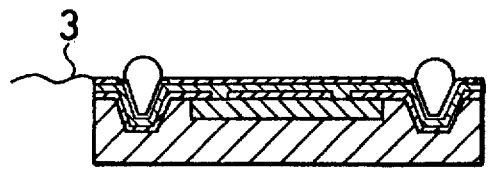

Then, as illustrated in FIG. 4G, the ball-bumps 5 are formed on the recessed portions 16. The ball-bumps 5 are formed as follows. First, soldering balls containing Pb—Sn as a chief ingredient are disposed on the recessed portions 16. Then, the soldering balls are heated to a melting point thereof. By melting the soldering balls, there can be formed ball-bumps fixedly connected to the underlying metal. Then, as illustrated in FIG. 4H, a lead 3 is connected to the semiconductor substrate 1 for supplying power to the semiconductor substrate 1 therethrough. Thus, the semiconductor device is completed.

The above mentioned first embodiment of the present invention provides a semiconductor device in which the ball-bumps are positioned with high accuracy in high adhesive force with underlying layers at lower costs but with high reliability.

Namely, in the formation of the recessed portions, an etching is carried out using a mask, and hence it is possible to form the recessed portions at just the designed locations. In addition, since the recessed portions are positioned with high accuracy, the ball-bumps which would be formed in subsequent steps can be positioned also with high accuracy. The ball-bumps are secured to the recessed portions via soldering material. Since there can be obtained a wider area for contacting the soldering material to the recessed portion, it is possible to secure the ball-bumps to the recessed portions with high adhesive force. In addition, it is relatively easy to set balls and soldering material on the formation of the ball-bumps, which enhances productivity with the result of decreased total costs. There never occurs leakage between the ball-bumps, because the oxide films electrically insulate the recessed portions and the ball-bumps from each other.

Thus, since the recessed portions are formed by means of lithography technique in the present invention, it would be easier to arrange the greater number of pins at a smaller pitch and form uniform ball-bumps in comparison with a semiconductor device having ball-bumps formed by a conventional process. Hence, it is possible to expect highly accurate contacts when the ball-bumps are connected to packaging modules.

Figure 5:
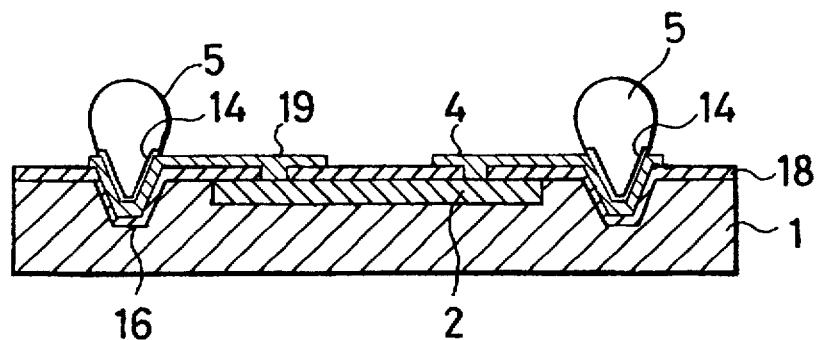
FIG. 5 is a cross-sectional view of a semiconductor device made in accordance with the second embodiment of the present invention.

Turning to FIG. 5, hereinbelow is described a semiconductor device to be made in accordance with the second embodiment of the present invention. A semiconductor substrate 1 is made of Ga—As family. The semiconductor circuit 1 is formed therein with recessed portions 16 having a reverse frusto-conical shape. A circuit region 2 is formed in the semiconductor substrate 1 between the adjacent recessed portions 16. In the circuit region 2, there is formed a certain circuit such as a tester for testing electrical performances of a semiconductor device, as mentioned later.

The semiconductor substrate 1 is covered with a protection film 18 made of polyimide, epoxy or bonzocyclobutene all of which have photo-sensitivity. The protection film 18 is covered with an electrically conductive wirings 4 so that the wirings 4 entirely cover the recessed portions 16. The electrically conductive wirings 4 are made of aluminum. The electrically conductive wirings 4 are in electrical connection with the circuit region 2 through through-holes 19 formed throughout the protection film 18. The protection film 18 is formed by means of lithography technique including steps of exposure and development.

An electrically conductive, thin film 14 made of Cr—Cu—Au is formed covering the aluminum wirings 4 within the recessed portions 16. Then, ball-bumps 5 are formed on the recessed portions 16.

The ball-bumps 5 are formed as follows. First, a certain amount of soldering material containing Pb-Sn as a chief ingredient is filled in the recessed portions 16 covered with the electrically conductive, thin film 14, by means of screen printing. Then, either plastic balls plated with metal such as nickel, copper, gold or solder or balls made of electrically conductive resin are put in the recessed portions 16. The soldering material is heated to a melting point thereof, and then the ball-bumps 5 are formed with the soldering material being melted.

The above mentioned second embodiment makes it possible to further decrease costs. In addition, the use of resin balls makes it possible to obtain a connection highly resistant to thermal stress, even though materials having different thermal expansion coefficients are to be used for a connection to a module. As to the other effects, the second embodiment has the same advantageous effects as the first embodiment.

Hereinbelow, probe cards made in accordance with the present invention are described with reference to FIGS. 6 to 11B.

Figure 6:
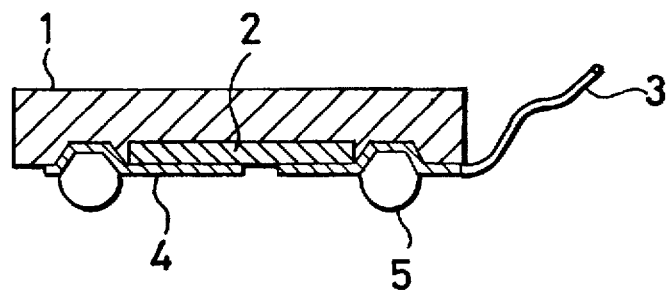
FIG. 6 is a cross-sectional view of a probe card made in accordance with the first embodiment of the present invention.

FIG. 6 illustrates a probe card made in accordance with the third embodiment of the present invention. It should be noted that FIG. 6 does not illustrate the protection film 18 and the electrically conductive, thin film 4 to be formed on a lower surface of the semiconductor substrate 1 for the sake of clarity. For the same reason, FIGS. 7 to 11B do not illustrate them, either.

The probe card illustrated in FIG. 6 is to be fabricated in the same steps as those illustrated in FIGS. 4A to 4H. Electrical power is provided to the probe card through the lead 3. By using the circuit region 2, which is constructed as a semiconductor device, as a tester device, there can be obtained a probe card containing a tester device therein, and hence the probe card itself acts as a tester. The probe card having the above mentioned structure provides the following advantages.

A. An expensive tester is no longer necessary, because the probe card contains a tester device.

B. Since the probe card is made of the same material as a material of which a device to be tested is made, there is not generated a stress due to a difference in material. As a result, there occurs no shift and contact defectiveness.

C. Since the recessed portions are formed in place by lithography technique, it is possible to increase pins at a smaller pitch. Since the recessed portions can be located in intended positions with high accuracy and hence the ball-bumps are formed in the recessed portions, there can be obtained highly accurate contact of the ball-bumps to a device to be tested.

D. An oxide film electrically insulates the recessed portions from one another and further the ball-bumps from one another, and hence there does not occur leakage between the ball-bumps. As a result, it is possible to conduct a test with electrically high accuracy.

Figure 1B:
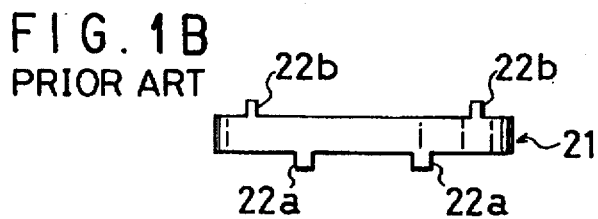
Figure 1C:
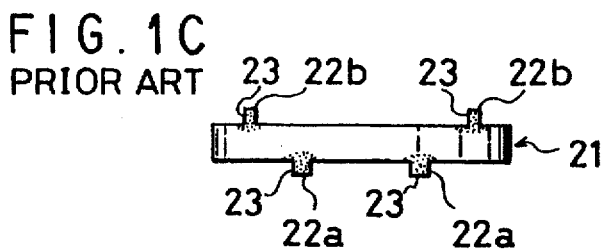
Figure 1D:
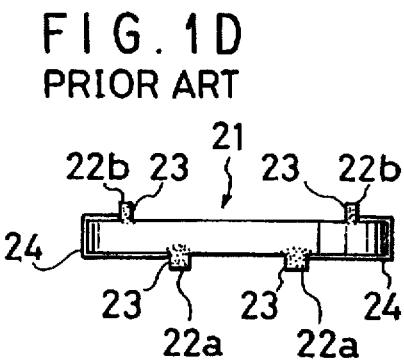
Figure 2A:
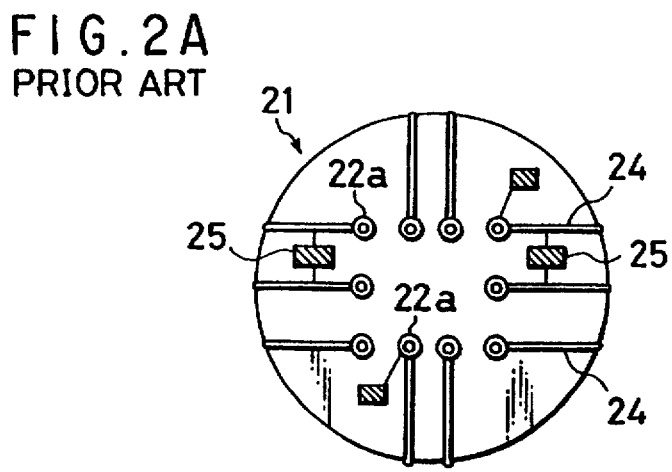
FIG. 2A is a top view of a conventional probe card, illustrating ball-bumps for a wafer chip.
Figure 2B:
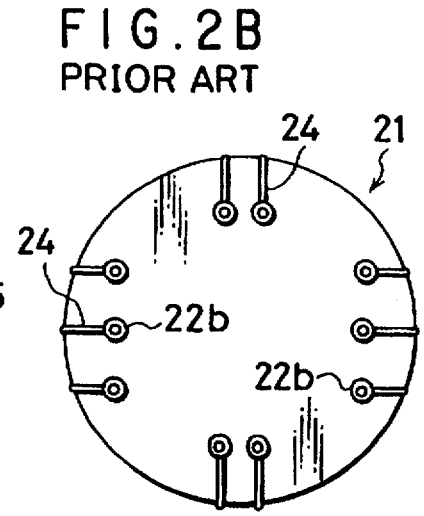
FIG. 2B is a bottom view of a conventional probe card of FIG. 2A, illustrating ball-bumps for a tester.

E. The ball-bumps are repairable in the present invention unlike the conventional ball-bumps as illustrated in FIGS. 1B to 1D. Thus, a probe card made in accordance with the present invention could be repaired only by exchanging a defective ball-bump to a new one, whereas conventionally a probe card had to be exchanged to a new probe card.

F. The probe card made in accordance with the present invention makes it no longer necessary to prepare a tester, and hence provides a greater efficiency with respect to equipment arrangement per a floor area than a conventional auto-prober.

G. The probe card to be made in accordance with the present invention can be readily fabricated by means of a conventional method of fabricating a semiconductor device. Namely, a high-degree technique is not necessary to make the probe card.

Figure 7:
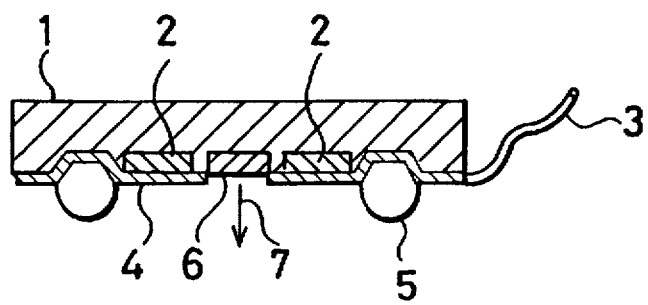
FIG. 7 is a cross-sectional view of a probe card made in accordance with the second embodiment of the present invention.

With reference to FIG. 7, hereinbelow is described a probe card made in accordance with the fourth embodiment of the present invention. The illustrated probe card has the same structure as the probe card made in accordance with the third embodiment as illustrated in FIG. 6 except that a light emitting device 6 is formed in the circuit region 2. In this embodiment, the semiconductor substrate 1 is made of GaAs. The light emitting device 6 can be readily fabricated by means of diffusion process.

The light emitting device 6 acts as a marker to defective semiconductor devices during testing of semiconductor devices with respect to electrical performances. When a semiconductor device is found defective, the light emitting device 6 emits a light 7 to the defective semiconductor device, thereby marking the defective semiconductor device. The probe card makes it possible to immediately judge as to whether a semiconductor device is defective or not.

Figure 8:
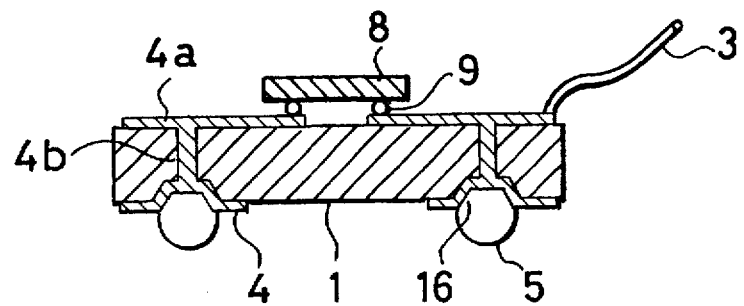
FIG. 8 is a cross-sectional view of a probe card made in accordance with the third embodiment of the present invention.

Turning to FIG. 8, hereinbelow is described a probe card made in accordance with the fifth embodiment of the present invention. First, the recessed portions 16 are formed at a lower surface of the semiconductor substrate 1, and then the ball-bumps 5 are formed within the recessed portions 16. Then, the electrically conductive wirings 4 are formed in a pattern 4a on an upper surface of the semiconductor substrate 1. The circuit pattern 4a is electrically connected to the electrically conductive wirings 4 formed within the recessed portions 16 through contact holes 4b formed throughout the semiconductor substrate 1. A semiconductor chip 8 is placed on the electrically conductive wirings 4, and then is electrically connected to the wirings 4 through ball-bumps 9 to thereby constitute an electric circuit acting as a tester. Finally, a lead 3 is connected to the circuit pattern 4a made of the electrically conductive wirings 4. The semiconductor chip 8 has a function of changing specification of a tester, and carries out specification change by a repair.

Thus, the probe card made in accordance with the fifth embodiment provides an electric circuit for a tester. Hence, it is possible to have an electric circuit for a tester by means of the semiconductor chip 8 before a tester device is completed, which would be convenient for urgent need of a tester device.

Figure 9:
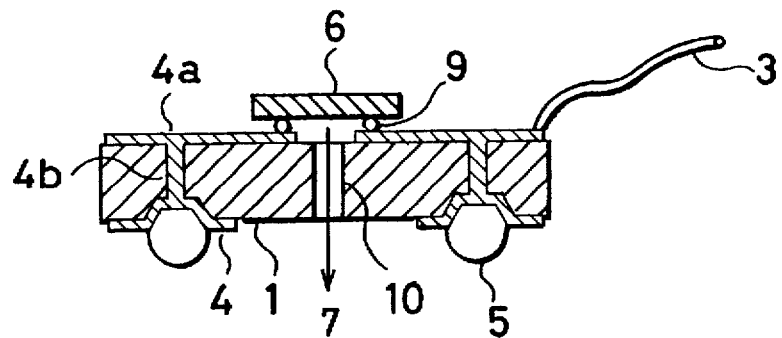
FIG. 9 is a cross-sectional view of a probe card made in accordance with the fourth embodiment of the present invention.

Turning to FIG. 9, a probe card is described to be made in accordance with the sixth embodiment of the present invention. The probe card has the same structure as that of the probe card of the fifth embodiment as illustrated in FIG. 8 except that the probe card of the sixth embodiment has a light emitting device 6 in place of the semiconductor chip 8 and that the semiconductor substrate 1 is formed with a through hole 10 just below the light emitting device 6, through which the light emitting device 6 emits a light 7. The through hole 10 is formed by laser or etching.

When a tested semiconductor device is found defective, the light emitting device 6 emits a light 7 to the defective semiconductor device, thereby the defective semiconductor device being marked. Namely, the probe card acts also as a marker to defective semiconductor devices.

Figure 3:
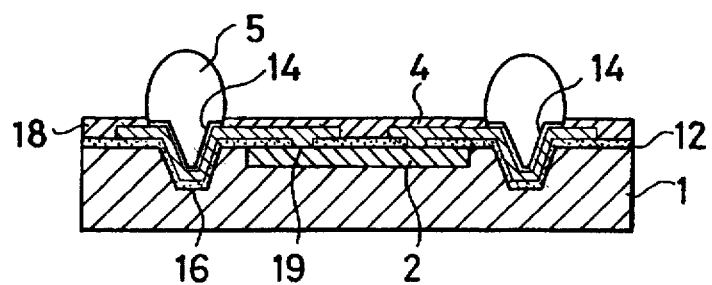
FIG. 3 is a cross-sectional view of a semiconductor device made in accordance with the first embodiment of the present invention.
Figure 10:
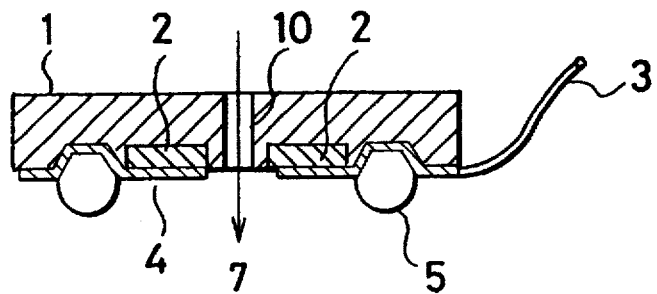
FIG. 10 is a cross-sectional view of a probe card made in accordance with the fifth embodiment of the present invention.

Turning to FIG. 10, a probe card made in accordance with the seventh embodiment of the present invention is described hereinbelow. The illustrated probe card has the same structure as the probe card made in accordance with the first embodiment as illustrated in FIG. 3 except that the semiconductor substrate 1 is formed centrally with a through hole 10 so that a light 7 such as laser and a probe can pass therethrough to mark a defective semiconductor device. Thus, the probe card acts also as a marker to defective semiconductor devices.

Figure 11A:
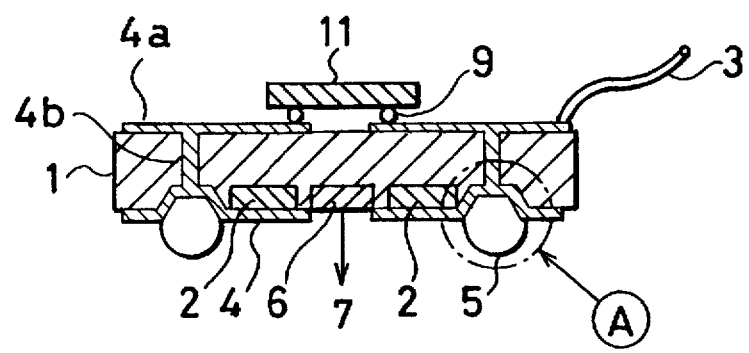
FIG. 11A is a cross-sectional view of a probe card made in accordance with the sixth embodiment of the present invention.
Figure 11B:
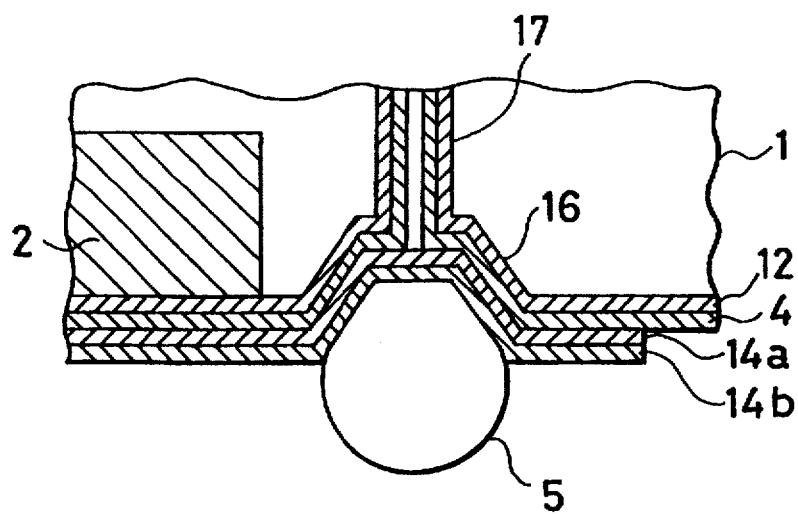
FIG. 11B is an enlarged cross-sectional view of a portion A in FIG. 11A.

Turning to FIGS. 11A and 11B, a probe card made in accordance with the eighth embodiment of the present invention is described. The eighth embodiment has a structure obtained by combining the fourth and fifth embodiments together. A device 11 for changing specification of a tester device is mounted on an upper surface of the semiconductor substrate 1 through the ball-bump 9, whereas the circuit region 2 and the light emitting device 6 are formed below a lower surface of the semiconductor substrate 1. The probe card has two functions, one of which is to change specification of a tester device, and the other is to mark semiconductor devices which have been found defective by testing.

FIG. 11B is an enlarged view of a portion of FIG. 11A enclosed with a capital letter "A", and illustrates a structure for electrically connecting the electrically conductive wirings 4, formed on the upper and lower surfaces of the semiconductor substrate 1, to each other. The process of fabricating the probe card is similar to the steps illustrated in FIGS. 4A to 4H.

First, the recessed portion 16 is formed with the semiconductor substrate 1 at a surface below which the circuit region 2 is formed. Then, a through hole 17 is formed communicating the recessed portion 16 to an upper surface of the semiconductor substrate 1 by using laser or by etching. Then, the metallic oxide film 12 is formed to thereby electrically insulate the recessed portion 16 and through hole 17 from the semiconductor substrate 1. Then, the electrically conductive wiring 4 made of aluminum is patterned on the metallic oxide film 12 by sputtering or evaporation. Then, the protection film 18 (not illustrated) is formed except on the recessed portion 16. On the protection film 18 are formed a Ni layer 14a and an Au layer 14b as electrically conductive, thin films by electrolysis plating or non-electrolysis plating. Finally, the ball-bump 5 is formed within the recessed portion 16. Thus, the probe card of the present embodiment can be readily fabricated basically by semiconductor diffusion process.

Although the protection film is made of polyimide resin in the semiconductor device and probe card to be fabricated in accordance with the above mentioned embodiments, material of which the semiconductor device or probe card is made is not to be limited to them. For instance, they may be made of organic material such as epoxy resin and benzocyclobutene or inorganic material such as various metallic oxide films.

The electrically conductive, thin film 14 may be made of Ti—Au or Ni—Au in place of Cr—Cu—Au of which the film 14 is made in the semiconductor device of the first and second embodiments.

In addition, the ball-bumps 5 may be formed by using soldering material containing Sn—Ag, Sn—Zn, Au—Sn, Au or In as a chief ingredient in place of the soldering material containing Pb—Sn used in the above mentioned embodiments.

In view of the above mentioned embodiments, the present invention provides advantages as follows.

Since the recessed portions are formed by using lithography technique, the ball-bumps can be positioned exactly in place with the result of highly accurate contact to a module. Hence, it is possible to obtain a semiconductor device at a low cost which includes highly reliable ball-bumps having high adhesive strength. Namely, since the recessed portions are formed by masking and then etching, the recessed portions can be located at just intended places. Accordingly, the ball-bumps which would be formed in subsequent steps can be positioned exactly in place.

The ball-bumps are secured to a surface of the recessed portions by using soldering material. There can be obtained a wide area for contact of the ball-bumps and soldering material, and hence it is possible to obtain high adhesive force therebetween. It is relatively easy to set balls and soldering material in the formation of the ball-bumps, which would decrease total fabrication costs.

Since the recessed portions and ball-bumps are electrically insulated from one another by oxide films, respectively, there does not occur leakage between the ball-bumps.

If the ball-bumps were made of resin, there could be obtained connection between the ball-bumps and a module, which connection is highly resistant to thermal stress even between materials having different thermal expansion coefficiencies.

As mentioned earlier, the semiconductor device made in accordance with the present invention can be used as a probe card having a function of a tester. Thus, it is no longer necessary to separately prepare a tester for testing electrical performances of semiconductor devices. In addition, the semiconductor device to be used as a probe card can adapt to a change in tester specification. Furthermore, the semiconductor device can provide a smaller-sized probe card than a conventional one.

The fabrication of the probe card can be readily accomplished by semiconductor diffusion process, and hence it is not necessary to use high-degree techniques. Accordingly, the semiconductor device acting as a probe card can be fabricated at a low cost. Although the above mentioned embodiments refer to a one-chip structure, the present invention can be applied to multi-chips and wafer-to-wafer probing.

The semiconductor device acting as a probe card makes contact with a device to be tested through ball-bumps, and thus it is possible to shorten a contact length. As a result, a test for electrical performances including high frequency can be carried out at high speed. Accordingly, the semiconductor device acting as a probe card makes it possible to carry out a test for items which could not be carried out unless a tester is assembled to a package.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A semiconductor device comprising:
    a semiconductor substrate formed thereon with at least one recessed portion;
    an electrically conductive layer covering at least a surface of said recessed portion therewith;
    a thin, electrically conductive film formed over said electrically conductive layer within said recessed portion;
    a protection film formed over said electrically conductive layer, wherein an edge portion of said protection film abuts an edge portion of said thin, electrically conductive film; and
    a ball-bump formed on said electrically conductive layer within said recessed portion.

2. The semiconductor device as set forth in claim 1, wherein said thin, electrically conductive film is made of one of Ti—Cu, Ni—Au and Cr—Cu—Au.

3. The semiconductor device as set forth in claim 1, wherein said semiconductor substrate is made of silicon and said recessed portion is formed on a surface having Miller indices of (100).

4. The semiconductor device as set forth in claim 1 further comprising a metallic oxide film formed below said electrically conductive layer.

5. The semiconductor device as set forth in claim 1, wherein said ball-bump is formed by using soldering material which contains one of Pb—Sn, Sn—Ag, Sn—Zn, An—Sn, Au and In as a principal ingredient.

6. The semiconductor device as set forth in claim 1, wherein said ball-bump is made of plastics plated with metal.

7. The semiconductor device as set forth in claim 1, wherein said ball-bump is made of electrically conductive resin.

8. The semiconductor device as set forth in claim 2, wherein said electrically conductive layer is formed over said semiconductor substrate.

9. The semiconductor device as set forth in claim 8, wherein said protection layer is made of one of polyimide resin.

10. The semiconductor device as set forth in claim 8, wherein said protection layer is made of one of polyimide resin, epoxy resin and bonzocyclobutene resin.

11. A semiconductor device comprising:
    a semiconductor substrate formed thereon with at least one recessed portion;
    a circuit pattern formed in said semiconductor substrate;
    an electrically conductive layer covering at least a surface of said recessed portion therewith;
    a ball-bump formed on said electrically conductive layer within said recessed portion; and
    a tester device formed in said semiconductor substrate, said tester device having a function of testing electrical performances of a semiconductor device so that said semiconductor device can act as a probe card;
    wherein said circuit pattern is electrically connected to said electrically conductive layer via through holes formed in said semiconductor substrate.

12. The semiconductor device as set forth in claim 11, wherein said semiconductor substrate is made of GaAs and said tester device includes a light emitting device therein which is designed to emit a light to a semiconductor device which has been found defective by said tester device.

13. The semiconductor device as set forth in claim 11, wherein said ball-bump is made of one of metal plated plastics, electrically conductive resin, metal and resilient material.

14. A semiconductor device comprising:
    a semiconductor substrate formed on one of upper and lower surfaces thereof with at least one recessed portion;
    an electrically conductive layer covering at least a surface of said recessed portion therewith;
    a ball-bump formed on said electrically conductive layer within said recessed portion;
    a circuit pattern formed on the other of said upper and lower surfaces from said semiconductor substrate, said circuit pattern being electrically connected to said electrically conductive layer via through holes formed in said semiconductor substrate; and
    a semiconductor chip disposed on said circuit pattern in electrical connection therewith to constitute a tester device having a function of testing electrical performances of a semiconductor device so that said semiconductor device can act as a probe card.

15. The semiconductor device as set forth in claim 14, wherein said semiconductor chip is electrically connected to said circuit pattern by means of one of a ball-bump, wire bonding, TAB and a beam lead.

16. The semiconductor device as set forth in claim 14, wherein said semiconductor chip is designed to have a function for changing specification of said tester device.

17. The semiconductor device as set forth in claim 14 further comprising a light emitting device in place of said semiconductor chip, said semiconductor substrate being formed with a through hole, said light emitting device being disposed in alignment with said through hole and emitting a light through said through hole to a semiconductor device which has been found defective.

18. A semiconductor device comprising:
    a semiconductor substrate formed on one of upper and lower surfaces thereof with at least one recessed portion;
    an electrically conductive layer covering at least a surface of said recessed portion therewith;
    a ball-bump formed on said electrically conductive layer within said recessed portion;
    a circuit pattern formed on the other of said upper and lower surfaces from said semiconductor substrate, said circuit pattern being electrically connected to said electrically conductive layer via through holes formed in said semiconductor substrate;
    a tester device formed below said other of said upper and lower surfaces from said semiconductor substrate, said tester device having a function of testing electrical performances of a semiconductor device so that said semiconductor device can act as a probe card;
    a light emitting device being designed to emit a light to a semiconductor device which has been found defective by said tester device; and a semiconductor chip disposed on said circuit pattern in electrical connection therewith, said semiconductor chip being designed to have a function for changing specification of said tester device.

19. A semiconductor device comprising:

a semiconductor substrate formed thereon with at least one recessed portion;

a circuit pattern formed in said semiconductor substrate;

a protection film formed over a surface of said semiconductor substrate;

an electrically conductive layer covering at least a surface of said recessed portion therewith; and a ball-bump formed on said electrically conductive layer within said recessed portion;

wherein said circuit pattern is electrically connected to said electrically conductive layer via through holes formed in said semiconductor substrate.

20. The semiconductor device as set forth in claim 19, wherein said protection film is made of photosensitive material.

21. The semiconductor device as set forth in claim 19 further comprising a thin, electrically conductive film formed over said electrically conductive layer within said recessed portion, said thin, electrically conductive film being made of one of Ti—Cu, Ni—Au and Cr—Cu—Au.

22. The semiconductor device as set forth in claim 19 further comprising a tester device formed in said semiconductor substrate, said tester device having a function of testing electrical performances of a semiconductor device so that said semiconductor device can act as a probe card.

23. The semiconductor device as set forth in claim 22, wherein said semiconductor substrate is made of GaAs and said tester device includes a light emitting device therein which is designed to emit a light to a semiconductor device which has been found defective by said tester device.

24. A semiconductor device comprising:

a semiconductor substrate formed thereon with at least one recessed portion, wherein said semiconductor substrate is formed with at least one through hole through which a light is to pass or a probe is to be inserted;

an electrically conductive layer covering at least a surface of said recessed portion therewith;

a ball-bump formed on said electrically conductive layer within said recessed portion; and a tester device formed in said semiconductor substrate, said tester device having a function of testing electrical performances of a semiconductor device so that said semiconductor device can act as a probe card.

25. A semiconductor device comprising:

a semiconductor substrate formed thereon with at least one recessed portion, wherein said semiconductor substrate is formed with at least one through hole through which a light is to pass or a probe is to be inserted;

a protection film formed over a surface of said semiconductor substrate;

an electrically conductive layer covering at least said recessed portion therewith;

a ball-bump formed on said electrically conductive layer within said recessed portion; and a tester device formed in said semiconductor substrate, said tester device having a function of testing electrical performances of a semiconductor device so that said semiconductor device can act as a probe card.

* * * * *